(12) United States Patent
Takano (10) Patent No.: US 8,446,180 B2
(45) Date of Patent: May 21, 2013

(54) SEMICONDUCTOR DEVICE

(75) Inventor: Yoichi Takano, Tama (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 559 days.

(21) Appl. No.: 12/816,436

(22) Filed: Jun. 16, 2010

(65) Prior Publication Data

US 2011/0001517 A1    Jan. 6, 2011

(30) Foreign Application Priority Data

Jul. 1, 2009    (JP) .................................. 2009-156607

(51) Int. Cl.
*H03K 5/153* (2006.01)
(52) U.S. Cl.
USPC .......................................................... 327/77
(58) Field of Classification Search
USPC .......................................................... 327/77
See application file for complete search history.

(56) References Cited

U.S. PATENT DOCUMENTS 4,021,701 A * 5/1977 Davies ............................ 361/18

FOREIGN PATENT DOCUMENTS

JP            10-256486          9/1998

* cited by examiner

*Primary Examiner* — Daniel Rojas
(74) *Attorney, Agent, or Firm* — IPUSA, PLLC (57) ABSTRACT

A disclosed semiconductor device includes an input terminal, a power line, a pnp-bipolar transistor connected to the power line, a first resistor connecting an emitter of the transistor to the input terminal, a second resistor connecting a collector of the transistor to ground, an operation circuit operable when the input voltage is a predetermined voltage or higher, the predetermined voltage being set within a first voltage region in which the input voltage cannot turn on the transistor, a comparator comparing an internal voltage with a reference voltage, the internal voltage being changed from a voltage value in a non-conductive state in which the transistor is not turned on, and an output terminal configured to output an output voltage which changes in response to a result of comparing the internal voltage with the reference voltage.

9 Claims, 7 Drawing Sheets

SEMICONDUCTOR DEVICE

CROSS-REFERENCE TO RELATED APPLICATIONS

This patent application is based upon and claims the benefit of priority of Japanese Patent Application No. 2009-156607 filed on Jul. 1, 2009, the entire contents of which are incorporated herein by reference.

BACKGROUND OF THE INVENTION

1. Field of the Invention

The present invention generally relates to a semiconductor device which uses a testing terminal in common as another terminal.

2. Description of the Related Art

Figure 1:
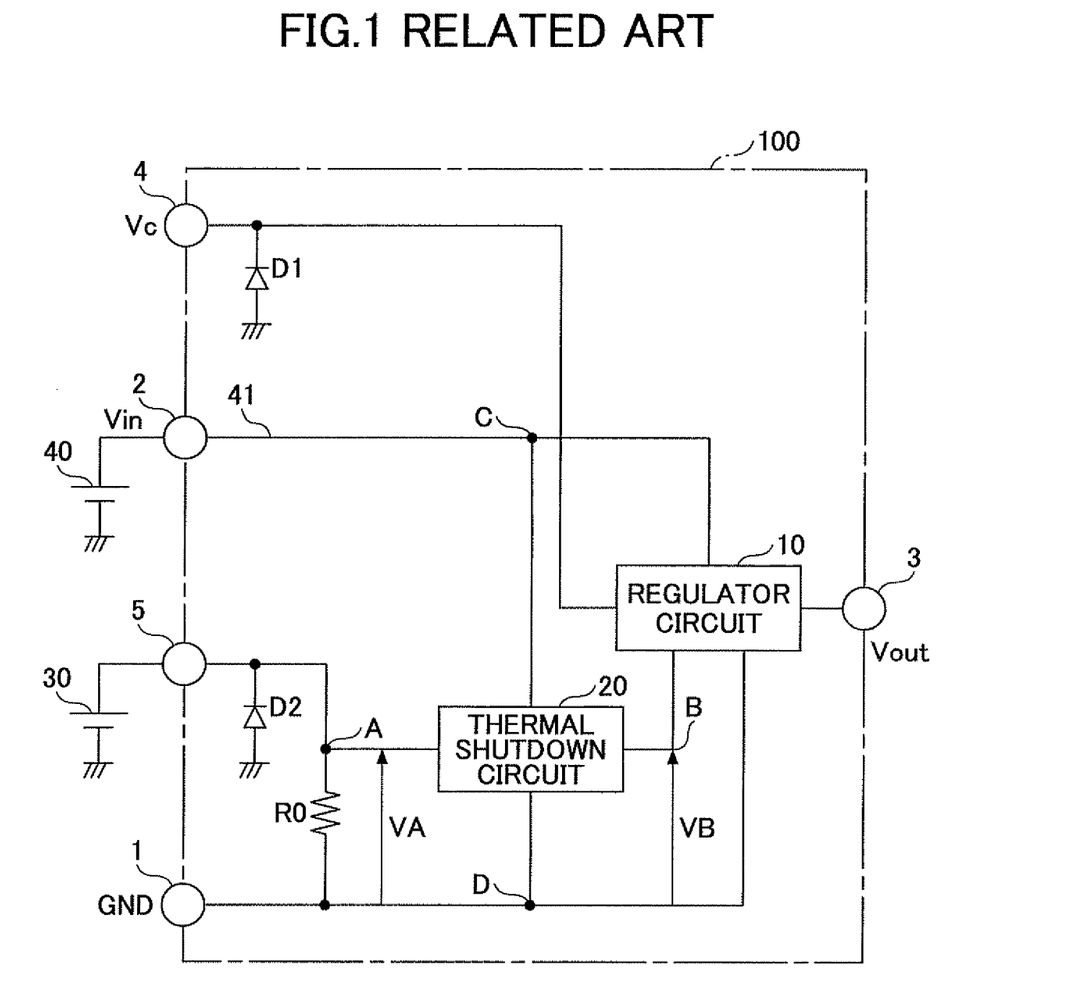
FIG. 1 illustrates an example circuit configuration of a regulator IC 100.

Terminals dedicated to tests for internal functions of semiconductor devices such as an IC may be provided. For example, when a thermal shutdown circuit 20 of a regulator IC 100 illustrated in FIG. 1 is checked, the output voltage of a direct-current (DC) power source 30 is applied to a testing terminal 5 to change the input voltage VA of the thermal shutdown circuit 20. When the input voltage VA is changed, the output voltage VB of the thermal shutdown circuit 20 is changed. An output signal Vout is changed when the output voltage VB of the thermal shutdown circuit 20 is changed. Therefore, it is possible to check the thermal shutdown circuit 20 inside the IC by monitoring the output signal Vout output outside the IC from the output terminal 3.

Figure 2:
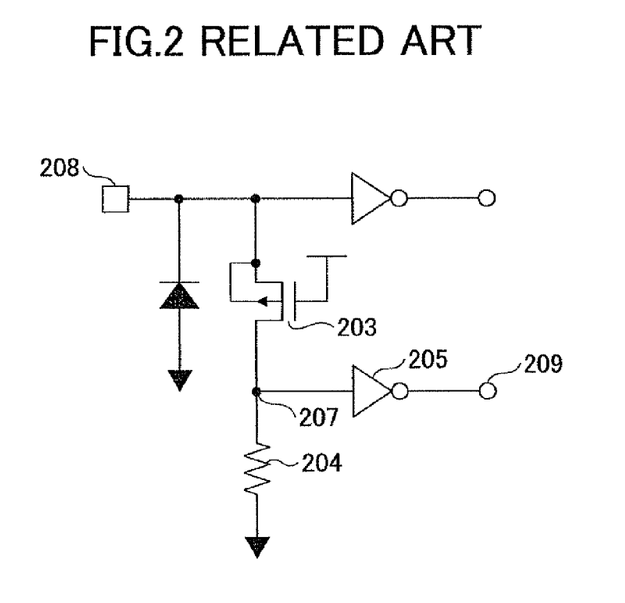
FIG. 2 illustrates an example circuit configuration of a semiconductor input circuit.

An example of a semiconductor input circuit may use an ordinary terminal as a testing terminal in order to omit the terminal dedicated to testing (Patent Document 1). FIG. 2 is a circuit configuration of the semiconductor input circuit described in Patent Document 1. Referring to FIG. 2, when a test mode is carried out, it is necessary to apply a power source voltage being not ordinarily used to an input terminal 208 which can be used not only as an ordinary terminal but also as a test terminal or more. In this case, because a p-channel MOS transistor 203 connected to the input terminal 208 is turned on and an electric current flows through a resistance element 204, the output signal output from a test mode output terminal 209 changes. By monitoring the output signal from the test mode output terminal 209, it is possible to detect a transition to the test mode.

However, when the resistance value of the resistance element 204 varies, the voltage of the node 207 also varies even when an identical voltage is input to the input terminal 208. Therefore, variation of the resistance value of an internal resistor such as the resistance element 204 greatly influences a result of checking functions of a predetermined internal circuit when an internal voltage such as the voltage of the node 207 is changed by an external input and an output voltage changing in response to the changed internal voltage is monitored to thereby check the functions of the predetermined internal circuit.

Therefore, the object of the embodiments is to provide a semiconductor device which can suppress an influence to a result of checking the internal circuit while providing the testing terminal used in common as another terminal even though there is variation in the resistance value of the internal resistor.

[Patent Document 1] Japanese Laid-open Patent Publication No. Hei. 10-256486

SUMMARY OF THE INVENTION

Accordingly, embodiments of the present invention may provide a novel and useful semiconductor device solving one or more of the problems discussed above.

According to the first aspect of the embodiments, there is provided a semiconductor device including an input terminal, a power line connectable to a power source, a pnp-bipolar transistor, a base of which is connected to the power line, a first resistor configured to connect an emitter of the transistor to the input terminal, a second resistor configured to connect a collector of the transistor to ground, an operation circuit which is operable when an input voltage is a predetermined voltage or higher, the predetermined voltage being set within a first voltage region in which the input voltage cannot turn on the transistor, a comparator configured to compare an internal voltage with a reference voltage, the internal voltage being changed from a voltage value in a non-conductive state in which the transistor Q1 is not turned on, and an output terminal configured to output an output voltage which changes in response to a result of comparing the internal voltage with the reference voltage.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 3 through FIG. 7 of embodiments of the present invention. In the embodiments, the following reference symbols typically designate the corresponding elements:

1: Ground terminal;
2: Power input terminal;
3: Output voltage terminal;
4: Control input terminal;
5: Testing terminal;
10: Regulator circuit;
20: Thermal shutdown circuit;
21, 22: Constant current source;
23: Comparator;
24: Sense diode;
41: Power line;
100, 200, 300: Regulator IC;
D1: Protection element for static charge; and
Q1, Q4: PNP-bipolar transistor.

Figure 3:
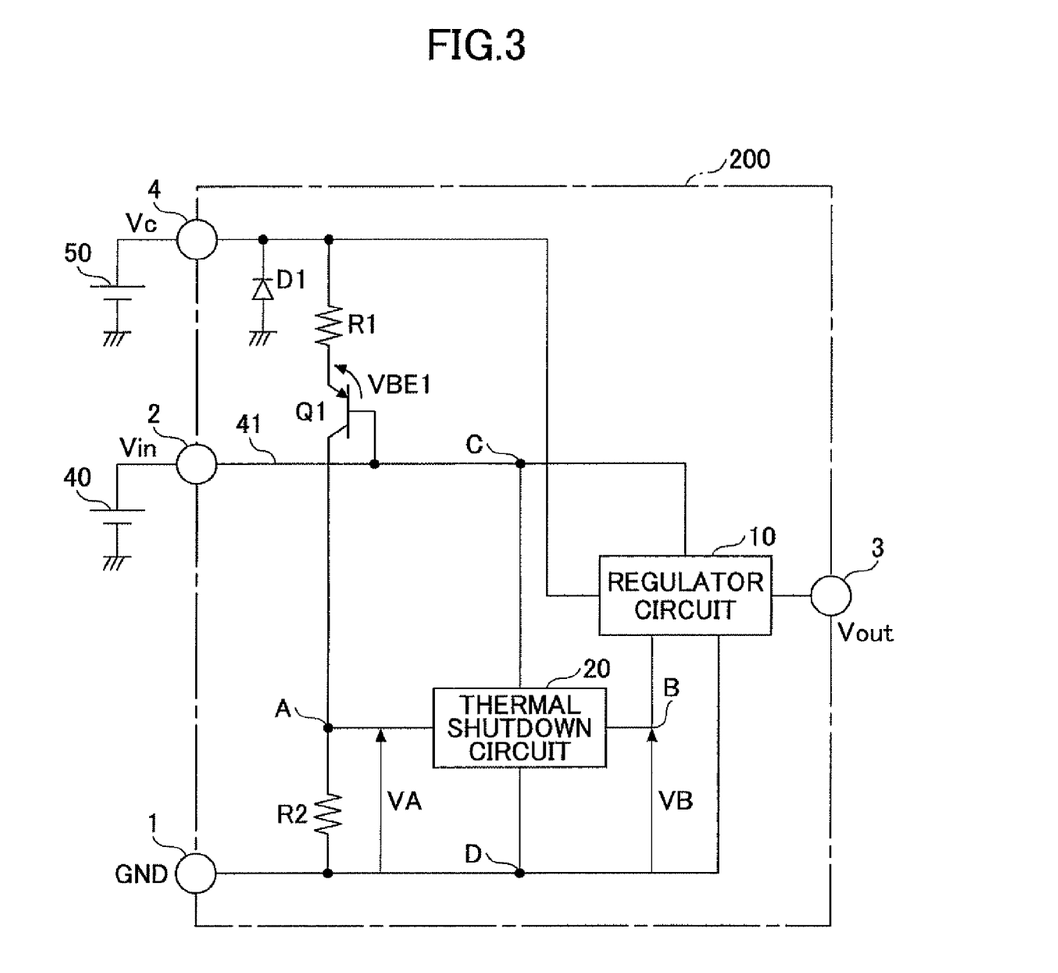
FIG. 3 illustrates an example circuit configuration of a regulator IC 200 of a semiconductor device of Embodiment 1.

FIG. 3 illustrates the example circuit configuration of a regulator IC 200 in a semiconductor device of an embodiment. The regulator IC 200 includes a ground terminal 1, a power input terminal 2, an output voltage terminal 3, and a control input terminal 4 in order to connect with the outside. The ground terminal 1 is connected to ground (GND) substantially having a voltage of 0 V. The power input terminal 2 is connected to a DC power source 40. The DC power source 40 is connected to a power line 41 in the regulator IC 200 through the power input terminal 2. An input voltage Vin, for example 3 V or more and 15 V or less, is input to the power line 41 through the power input terminal 2. The example of the DC power source 40 is a secondary battery and a converter. The output voltage terminal 3 is connected to an output pathway for supplying an output current Iout to a load. An output voltage Vout is output from the output voltage terminal 3. A control input voltage Vc is input to the control input terminal 4 for switching on or off the output voltage Vout.

The regulator IC 200 includes the control input terminal 4 and a pnp-bipolar transistor Q1. The base of the pnp-bipolar transistor Q1 is connected to the power line 41. The regulator IC 200 has a resistor R1 provided between the emitter of the transistor Q1 and the control input terminal 4 as a first resistor, and also includes a resistor R2 provided between the collector of the transistor Q1 and ground as a second resistor. The regulator IC 200 includes a regulator circuit 10 as a first circuit and a thermal shutdown circuit 20 as a second circuit. The thermal shutdown circuit 20 is to protect the regulator IC from heat. The regulator circuit 10 is operated when the control input voltage Vc from the control input terminal 4 is a predetermined threshold voltage Vth or higher. The threshold voltage Vth is determined to be within a first voltage region by which the transistor Q1 is not turned on. The threshold voltage Vth may be set lower than the input voltage Vin. For example, when the input voltage Vin is DC 10 V, the threshold voltage Vth is determined to be 5 V. For example, when the input voltage Vin is DC 5 V, the threshold voltage Vth is determined to be 3 V.

The thermal shutdown circuit 20 includes a comparator 23 (see FIG. 7) for comparing an internal voltage VA with a reference voltage Vref. The voltage value of the internal voltage VA changes when an electric current flows through the resistor R2 in a second voltage region of the control input voltage Vc, by which the transistor Q1 is turned on from the non-conductive state in which the transistor Q1 is not turned on. Because the transistor Q1 is a pnp type, the second voltage region in which the transistor Q1 is turned on is the maximum voltage value in the first voltage region, by which the transistor is not turned on, or more. Further, the regulator IC 200 includes the output voltage terminal 3 for outputting the output voltage Vout which changes in response to a comparison result between the internal voltage VA and the reference voltage Vref.

In the regulator IC 200, a testing terminal for checking functions of the thermal shutdown circuit 20 may be used in common as the control input terminal 4. Simultaneously, even though the resistance values of the resistors R1 and R2 vary, it is possible to suppress an influence on results of the function testing of the thermal shutdown circuit 20.

By setting a voltage range, to which the control input voltage Vc may belong, within the first voltage region in which the transistor Q1 is not turned on in an ordinary state, in which the regulator IC 200 is used as a product, it is possible to prevent the transistor Q1 from turning on even if the control input voltage Vc is input to the ordinary state. By making the control input voltage Vc to be the threshold voltage Vth or higher, it is possible to cause the regulator circuit 10 to be operable. By making the control input voltage Vc to be less than the threshold voltage Vth, it is possible to prevent the regulator circuit from being operable. When the output voltage Vout is output while the regulator circuit 10 is operable, it becomes possible to cause the output voltage Vout to be output from the output voltage terminal 3 by making the control input voltage Vc to be the threshold voltage Vth or higher. When the output voltage Vout is not output while the regulator circuit 10 is inoperable, it becomes possible to prevent the output voltage Vout from being output from the output voltage terminal 3 by making the control input voltage Vc to be less than the threshold voltage Vth.

In the ordinary state in which the regulator circuit 10 is inoperable, the transistor Q1 is not turned on. Therefore, the comparator 23 inside the thermal shutdown circuit 20 may compare the internal voltage VA, at which the transistor is not turned on, with the reference voltage Vref. As a result, it becomes possible to cause the output voltage Vout to be output from the output voltage terminal 3. The voltage Vout corresponds to a result of comparing the internal voltage VA, at which the transistor Q1 is not turned on, with the reference voltage Vref.

On the other hand, by determining the voltage range which may be taken by the control input voltage Vc in the control input terminal 4 to be the second voltage region, in which the transistor can be turned on, while the regulator IC 200 is checked, it is possible to turn on the transistor Q1 when the control input voltage Vc is input. For example, this may be carried out in a checking state before the regulator IC 200 is shipped from the factory as a product. Since the transistor Q1 is the pnp type, the second voltage region is higher than the first voltage region. Therefore, when the control input voltage Vc is within the second voltage region, the control input voltage Vc is the threshold voltage Vth or higher. Thus, in the checking state, the regulator circuit 10 is operable in a manner similar to the above ordinary state.

In the checking state in which the regulator circuit 10 is operable, the transistor Q1 is turned on. Therefore, the comparator 23 inside the thermal shutdown circuit 20 may compare the internal voltage VA, at which the transistor Q1 is turned on to enable an electric current to flow through the resistor R2, with the reference voltage Vref. As a result, it becomes possible to cause the output voltage Vout to be output from the output voltage terminal 3. The voltage Vout corresponds to a result of comparing the internal voltage VA, at which the transistor Q1 is turned on to enable an electric current to flow through the resistor R2, with the reference voltage Vref.

In the checking state, it is possible to simultaneously sweep the control input voltage Vc within the second voltage region and the internal voltage VA. In response to the internal voltage VA, the results of comparing the internal voltage VA with the reference voltage Vref obtained by the comparator 23 inside the thermal shutdown circuit 20 change. The output voltage Vout also changes in response to the results. Said differently, by monitoring the output signal Vout output outside the IC from the output terminal 3 while sweeping the output voltage (i.e. the control input voltage Vc) of the DC power source 50 on a side of a checking device connected to the control input terminal 4, it is possible to check whether the reference voltage Vref set up in the comparator of the thermal shutdown circuit 20 of the manufactured IC is normally designed. When the timing of changing the output voltage Vout is out of a predetermined normal determination timing, it is possible to assume that the reference voltage Vref does not have the normal value. By sweeping the control input voltage Vc to measure the value of the control input voltage Vc when the output voltage Vout changes, the set value of the reference voltage Vref can be assumed.

Thus, it is possible to turn on the transistor Q1 only when the function testing of the thermal shutdown circuit 20 (especially, testing of the reference voltage Vref) is carried out. Therefore, circuit operation in the ordinary state is not influenced by the transistor Q1.

When the base-emitter voltage of the transistor Q1 is designated by VBE1, the following relationship is established in reference to FIG. 3.

$$VA=(R2/R1)\times(Vc-Vin-VBE1) \qquad \text{Formula 1}$$

According to Formula 1, it is possible to suppress variation between resistance values of the resistors R1 and R2 with an effect of the factor of (R2/R1). If both of the resistance values of the resistors R1 and R2 vary, variation of the internal voltage VA can be suppressed, thereby enabling one to accurately check the set voltage value Vref of the reference voltage.

Referring to FIG. 3, a detailed configuration of the regulator IC 200 is described.

The transistor Q1 is turned on or off in response to the voltage value of the input voltage Vin. An electric current flows through the resistors R1 and R2 when the transistor Q1 is turned on.

The resistor R1 is provided between the emitter of the transistor Q1 and the control input terminal 4. The resistor R1 is inserted in a pathway between the emitter of the transistor Q1 and the control input terminal 4 in series. An electrostatic protection circuit is provided in the pathway connecting the emitter of the transistor Q1 to the control input terminal 4. By providing the electrostatic protection circuit, it is possible to prevent the internal circuit of the regulator IC 200 from malfunctioning and breaking. Referring to FIG. 3, a diode D1 is provided as the electrostatic protection circuit. The anode of the diode D1 is connected to ground, and the cathode of the diode D1 is connected to the control input terminal 4.

The resistor R2 is provided between the collector of the transistor Q1 and ground GND. The resistor R2 is inserted in a pathway connecting the collector of the transistor Q1 and ground GND in series.

Power is supplied to the regulator circuit 10 from the power line 41. The regulator circuit 10 is operated by the input voltage Vin as a power supply voltage. The regulator circuit 10 adjusts the output voltage Vout to a constant voltage even if the input voltage Vin input from the power line 41 changes. It is sufficient that the regulator circuit 10 may be a currently available circuit. Detailed description of the configuration of the regulator circuit 10 is omitted.

Power is supplied to the thermal shutdown circuit 20 from the power line 41. The thermal shutdown circuit 20 is operated by the input voltage Vin as a power supply voltage.

Figure 7:
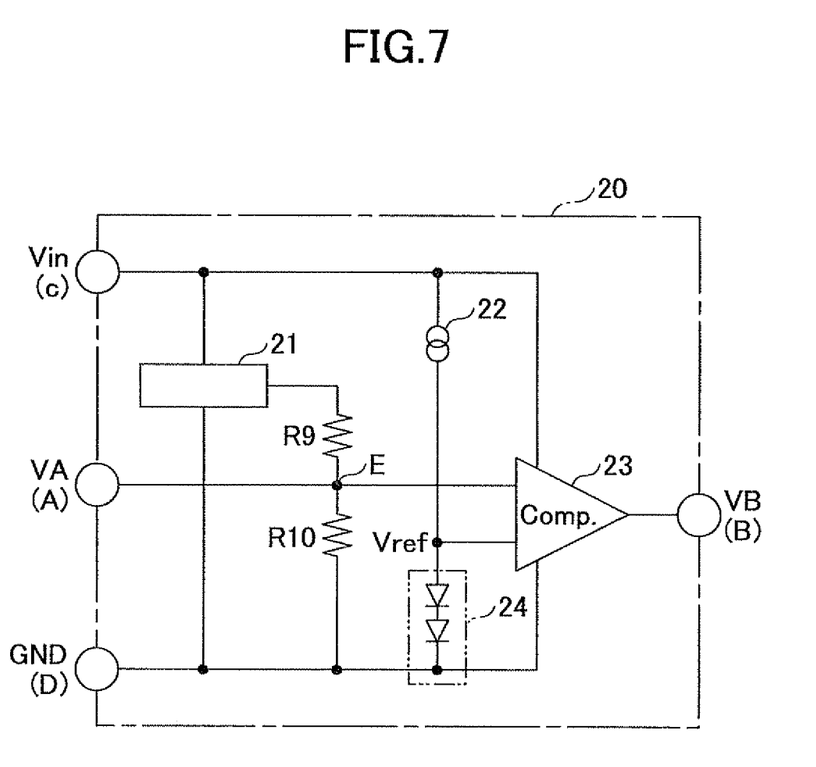
FIG. 7 illustrates an example circuit configuration of a thermal shutdown circuit 20 of the semiconductor device of the embodiments.

FIG. 7 illustrates an example circuit configuration of a thermal shutdown circuit 20 of the regulator IC 200 of the embodiment. The internal voltage VA is maintained to be a constant voltage by a power supplied from the power line 41 when the transistor Q1 is not turned on. A constant current is generated by a constant current source 21 operated by the input voltage Vin. The constant internal voltage VA is generated when the constant current flows through the internal resistor R2 (see FIG. 3) and internal resistors R9 and R10. The reference voltage Vref is generated by an electric current flowing from a constant current source 22 operated by the power supplied from the power line 41 to a sense diode 24. The sense diode 24 may change the reference voltage Vref in response to an ambient temperature. The comparator 23 is operated by the input voltage Vin as a power source. The internal voltage VA and the reference voltage Vref are compared. Referring to FIG. 3, when the internal voltage VA is higher than the reference voltage Vref, an output voltage VB of a first voltage level (e.g. high level) is output to the regulator circuit 10. Meanwhile, when the internal voltage VA is lower than the reference voltage Vref, the output voltage VB of a second voltage level (e.g. low level) is output to the regulator circuit 10.

Figure 4A:
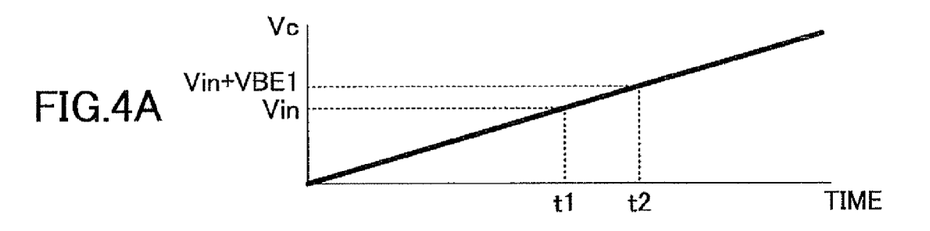
FIG. 4A, FIG. 4B and FIG. 4C are timing charts of the regulator IC 200 of Embodiment 1.
Figure 4B:
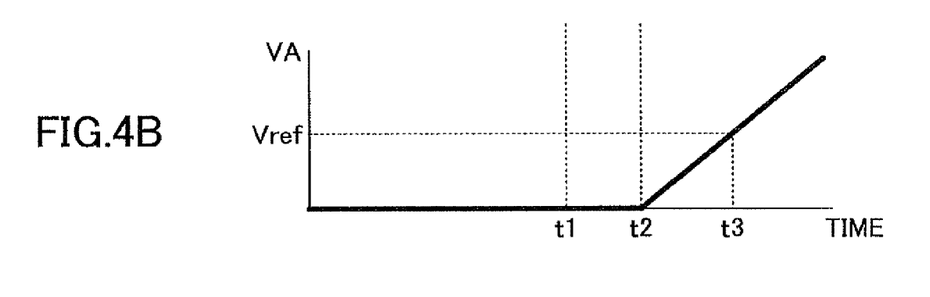
Figure 4C:
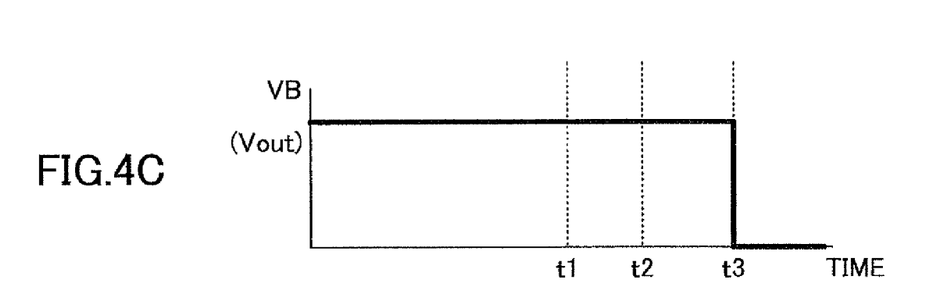

FIG. 4A, FIG. 4B and FIG. 4C are timing charts of the regulator IC 200 of Embodiment 1. Referring to FIG. 4A, the control input voltage Vc is gradually increased. Referring to FIG. 4B, an electric current flows through the resistor R2 after the transistor is turned on in a voltage range of the control input voltage Vc of (Vin+VBE1) or more (time t2). Then, the internal voltage VA increases as the control input voltage Vc increases in reference to FIG. 3, FIG. 4B and Formula 1. Referring to FIG. 4C, when the internal voltage VA reaches the reference voltage Vref, a voltage level of the output voltage VB of the comparator 23 is inverted. Therefore, the regulator circuit 10 stops outputting the output voltage Vout at time t3. Therefore, it is possible to check whether the output from the regulator circuit 10 is stopped by a normal function of the thermal shutdown circuit 20.

Embodiment 2

Figure 5:
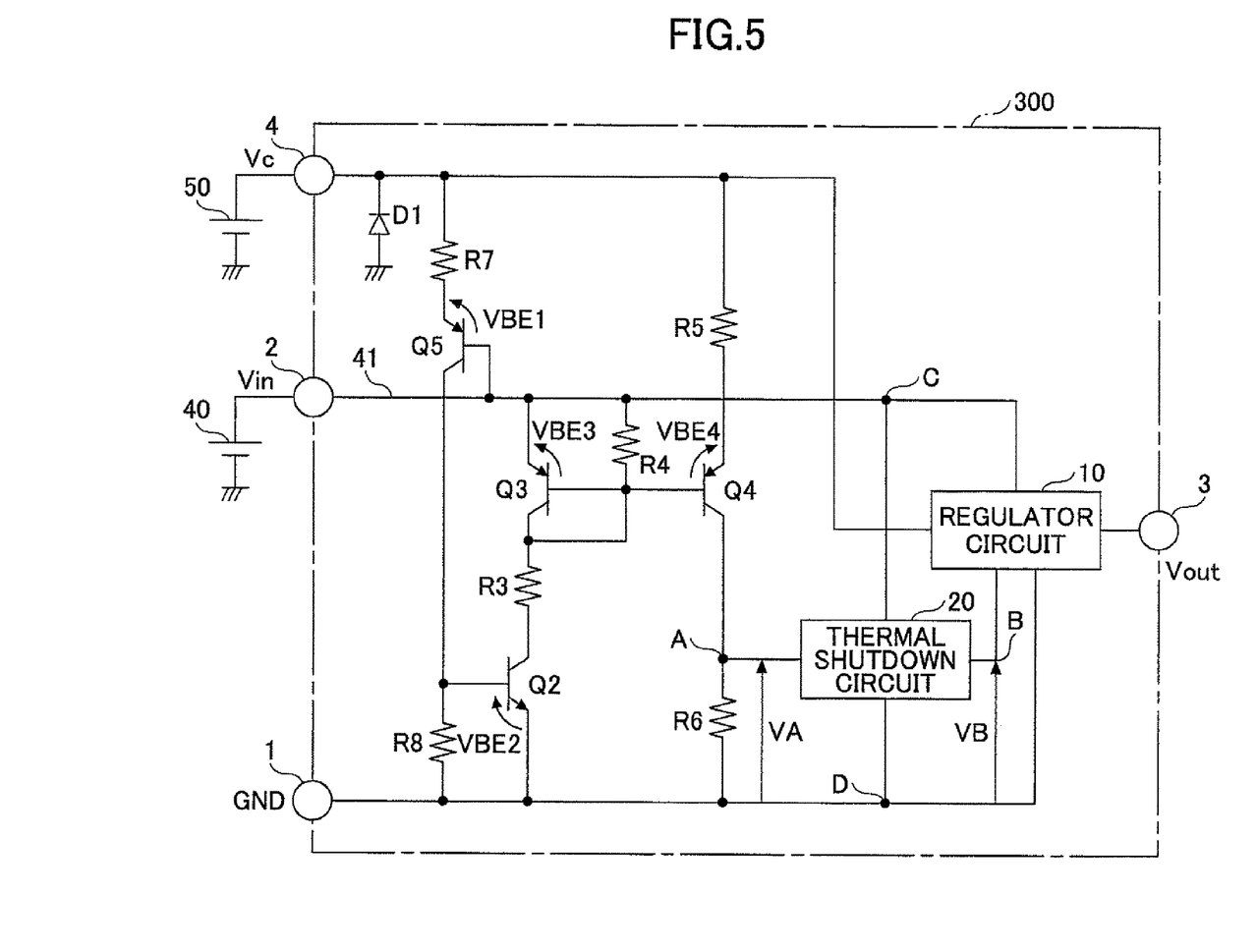
FIG. 5 illustrates an example circuit configuration of a regulator IC 300 in a semiconductor device of Embodiment 2.

FIG. 5 illustrates an example circuit configuration of a regulator IC 300 in a semiconductor device of Embodiment 2. A description of similar elements to those of the regulator IC 200 is omitted.

The regulator IC 300 includes a control input terminal 4 and a pnp-bipolar transistor Q4. The base of the pnp-bipolar transistor Q4 is connected to a power line 41 via a resistor R4. The regulator IC 300 further includes a resistor R5 provided between the emitter of the transistor Q4 and the control input terminal 4 as a first resistor, and also includes a resistor R6 provided between the collector of the transistor Q4 and ground GND as a second resistor. The regulator IC 300 includes a regulator circuit 10 as a first circuit and a thermal shutdown circuit 20 as a second circuit. The regulator circuit 10 is operated when a control input voltage Vc from the control input terminal 4 is a predetermined voltage Vth or higher. The threshold voltage Vth is determined to be within a first voltage region by which the transistor Q4 is not turned on. The threshold voltage Vth may be set lower than an input voltage Vin. For example, when the input voltage Vin is DC 10 V, the threshold voltage Vth is determined to be 5 V. For example, when the input voltage Vin is DC 5 V, the threshold voltage Vth is determined to be 3 V. The thermal shutdown circuit 20 includes a comparator 23 for comparing an internal voltage VA with a reference voltage Vref. The voltage value of the internal voltage VA changes when an electric current flows through the resistor R6 in a second voltage region of the control input voltage Vc, by which the transistor Q4 is turned on from the non-conductive state in which the transistor Q4 is not turned on. Further, the regulator IC 300 includes an output voltage terminal 3 for outputting the output voltage Vout which changes in response to a comparison result between the internal voltage VA and the reference voltage Vref.

Effects similar to those in the regulator IC 200 may be obtainable in the regulator IC 300 when the transistor Q1 of the regulator IC 200 is replaced by the transistor Q4 of the regulator IC 300. In the regulator IC 300, a testing terminal for checking functions of the thermal shutdown circuit 20 may be used in common as the control input terminal 4. Simultaneously, even though the resistance values of the resistors R1 and R2 vary, it is possible to suppress an influence on results of the function testing of the thermal shutdown circuit 20.

Referring to FIG. 5, the transistor Q4 is an output transistor of a current mirror circuit. The current mirror circuit includes a transistor Q3, the transistor Q4, the resistor R4 and the resistor R5. The emitter of the transistor Q3 is connected to the power line 41. The emitter of the transistor Q4 is connected to the control input terminal 4 via the resistor R5. The bases of the transistor Q3 and the transistor Q4 are connected to the power line 41 via the resistor R4. Further, the collector and the base of the transistor Q3 are connected. The emitter of a transistor Q5 is connected to the control input terminal 4 via a resistor R7. The base of a transistor Q2 is connected to the collector of the transistor Q5. The base of the transistor Q5 is connected to the power line 41. Therefore, when the transistor Q5 is turned on, the transistor Q2 is turned on. The base of the transistor Q2 is connected to ground GND via a resistor R8, and the emitter of the transistor Q2 is also connected to ground GND. The current mirror circuit connected to a resistor R3 via the collector of the transistor Q2 is operated when the transistor Q2 is turned on. An electric current flows through the resistor R6 when the transistor Q4 is turned on. The collector of the transistor Q2 is connected to the collector of the transistor Q3 via the resistor R3.

Referring to FIG. 5, when the base-emitter voltage of the transistor Q3 is referred to as VBE3, and the base-emitter voltage of the transistor Q4 is referred to as VBE4, Formula 2 is established as follows.

$$VA = (R6/R5) \times (Vc - Vin + VBE3 - VBE4) \quad \text{Formula 2}$$

Because VBE3 is substantially the same as VBE4, Formula 3 is established as follows.

$$VA = (R6/R5) \times (Vc - Vin) \quad \text{Formula 3}$$

If the respective resistance values of the resistors R5 and R6 vary, variation of the internal voltage VA can be suppressed, thereby enabling to accurately check a set voltage value as the reference voltage Vref. According to Formula 3, if the base-emitter voltage of the transistor Q3 varies, the internal voltage VA is not influenced. Therefore, the voltage value of the reference voltage Vref can be further accurately checked.

Figure 6A:
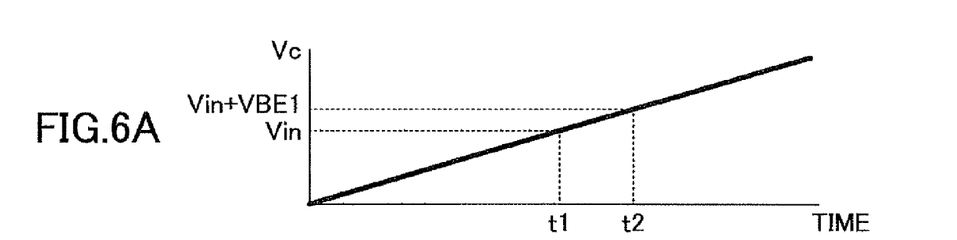
FIG. 6A, FIG. 6B and FIG. 6C are timing charts of the regulator IC 300 of Embodiment 2.
Figure 6B:
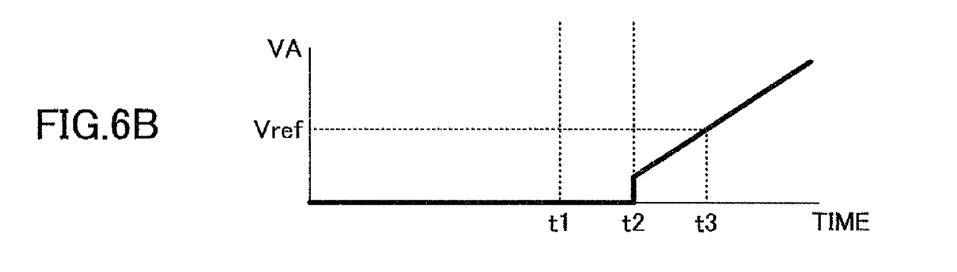
Figure 6C:
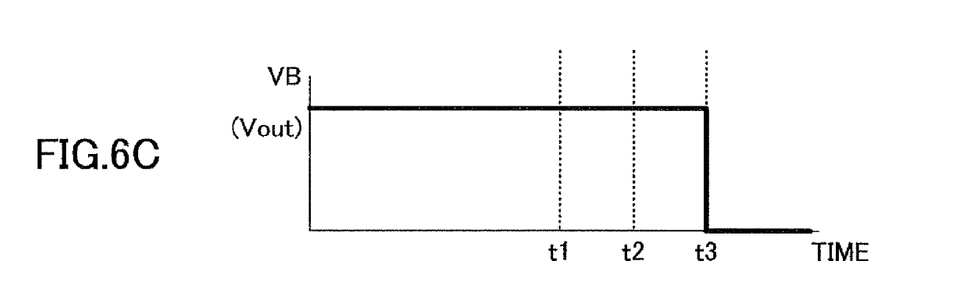

FIG. 6A, FIG. 6B and FIG. 6C are timing charts of the regulator IC 300 of Embodiment 2 in a test mode. Referring to FIG. 6A, the control input voltage Vc is gradually increased. The transistor Q5 is turned on in a voltage range of the control input voltage Vc of (Vin+VBE1) in reference to FIG. 5, FIG. 6B and Formula 3. When a reference current flows through the transistor Q3, an electric current flows through the transistor Q4 by a current mirror effect. Since the electric current flows through the resistor R6 when the transistor Q4 is turned on, an internal voltage VA increases as the control input voltage Vc increases. Referring to FIG. 6C, when the internal voltage VA reaches the reference voltage Vref, a voltage level of the output voltage VB of the comparator 23 illustrated in FIG. 7 increases to thereby stop outputting the output voltage Vout at time t3. Therefore, it is possible to check whether the output from the regulator circuit 10 is stopped by a normal function of the thermal shutdown circuit 20.

With Embodiment 2, variation of the internal voltage VA can be suppressed even if the resistance values of the internal resistors vary. Therefore, it is possible to accurately check the set voltage value as the reference voltage Vref. Especially, base-emitter voltages VBE of pnp-bipolar transistors show small variation in comparison with gate-source voltages of PMOS transistors. Therefore, it is possible to more accurately check set voltage values of the reference voltages Vref by using the pnp-bipolar transistors than by using the PMOS transistors.

The semiconductor input circuit illustrated in FIG. 2 has a configuration where the node 207 is connected to the inverter 205. Therefore, it is only possible to check whether the transition to the test mode is done. Meanwhile, Embodiment 2 enables the set voltage value of the reference voltage Vref to be accurately checked.

Further, the testing terminal can be used in common as another ordinarily used terminal by adding a relatively small element such as a transistor and a resistor. Therefore, it is possible to omit a relatively large protection element for static charge dedicated to the testing terminal to thereby reduce the chip area of a semiconductor device.

The inner reference voltage Vref can be checked using the testing terminal after molding the semiconductor device, it is possible to find defects occurring after assembling or molding the semiconductor device and to reject the defective semiconductor devices as inferior products.

Further, it is possible to check the thermal shutdown circuit without influencing an ordinary regulator operation. In the ordinary voltage region of the input voltage Vin, the additional circuit is not operated and current is not needlessly consumed.

Although the regulator has been exemplified as the semiconductor device in Embodiments 1 and 2, the present invention is applicable to a DC-DC converter, an AC-DC converter, a driving device for driving loads and so on. As described, Embodiments 1 and 2 provide semiconductor devices which can suppress influences to results of checking internal circuits while providing testing terminals used in common as other terminals even though there are variations in the resistance values of the internal resistors.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   an input terminal;
   a power line connectable to a power source;
   a pnp-bipolar transistor, a base of which is connected to the power line;
   a first resistor configured to connect an emitter of the transistor to the input terminal;
   a second resistor configured to connect a collector of the transistor to ground;
   an operation circuit which is operable when an input voltage is a predetermined voltage or higher, the predetermined voltage being set within a first voltage region in which the input voltage cannot turn on the transistor;
   a comparator configured to compare an internal voltage with a reference voltage, the internal voltage VA being changed from a voltage value in a non-conductive state in which the transistor is not turned on; and
   an output terminal configured to output an output voltage which changes in response to a result of comparing the internal voltage with the reference voltage.

2. The semiconductor device according to claim 1,
wherein the operation circuit changes the output voltage in response to the result of comparing the internal voltage with the reference voltage.

3. The semiconductor device according to claim 1,
wherein power is supplied to the operation circuit via the power line.

4. The semiconductor device according to claim 3,
wherein the output voltage is adjusted based on the power supplied via the power line.

5. The semiconductor device according to claim 1,
wherein power is supplied to the comparator via the power line.

6. The semiconductor device according to claim 1,
wherein the internal voltage is maintained to be a constant voltage by power supplied via the power line when the transistor is not turned on.

7. The semiconductor device according to claim 1,
wherein the reference voltage is generated by power supplied via the power line.

8. The semiconductor device according to claim 7,
wherein the reference voltage is generated when an electric current flows through a diode by the power supplied via the power line.

9. The semiconductor device according to claim 1,
wherein the transistor is an output transistor for a current mirror circuit.

* * * * *